(12) United States Patent
Brandenburg et al.

(10) Patent No.: US 7,486,515 B2
(45) Date of Patent: Feb. 3, 2009

(54) FLUID CIRCULATOR FOR FLUID COOLED ELECTRONIC DEVICE

(75) Inventors: Scott D. Brandenburg, Kokomo, IN (US); Suresh K. Chengalva, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/704,786

(22) Filed: Feb. 9, 2007

(65) Prior Publication Data
US 2008/0192430 A1 Aug. 14, 2008

(51) Int. Cl.
*H05K 7/20* (2006.01)
*F28F 7/00* (2006.01)
*F28D 15/00* (2006.01)
*H01L 23/34* (2006.01)

(52) U.S. Cl. ............... 361/703; 361/699; 361/709; 361/719; 165/80.4; 165/104.33; 257/714

(58) Field of Classification Search ......... 361/699–703, 361/715, 709, 719; 165/80.4–80.5, 104.33; 257/706–707, 712–714, 721–722; 417/413.1, 417/413, 3, 413.2
See application file for complete search history.

(56) References Cited

U.S. PATENT DOCUMENTS

| | | | | |
|---|---|---|---|---|
| 4,636,149 | A * | 1/1987 | Brown | 417/322 |
| 4,912,548 | A | 3/1990 | Shanker et al. | |
| 5,270,572 | A | 12/1993 | Nakajima et al. | |
| 5,349,831 | A | 9/1994 | Daikoku et al. | |
| 5,373,417 | A | 12/1994 | Barrett | |
| 5,424,913 | A * | 6/1995 | Swindler | 361/687 |
| 5,542,821 | A * | 8/1996 | Dugan | 417/53 |
| 5,659,171 | A * | 8/1997 | Young et al. | 250/289 |
| 5,901,037 | A | 5/1999 | Hamilton et al. | |
| 6,175,495 | B1 | 1/2001 | Batchelder | |
| 6,273,687 | B1 * | 8/2001 | Nogimori et al. | 417/413.1 |
| 6,278,607 | B1 * | 8/2001 | Moore et al. | 361/687 |
| 6,377,458 | B1 | 4/2002 | Morris et al. | |

(Continued)

FOREIGN PATENT DOCUMENTS

EP 0 321 944 6/1989

(Continued)

OTHER PUBLICATIONS http://www.temperatures.com/bimet.html, *Bimetallic Thermometers and Thermostats*, "How Thermometers Work" by Marshall Brain, © 1998-2007 HowStuffWorks, Inc., 5 pages.

(Continued)

*Primary Examiner*—Jayprakash N Gandhi
*Assistant Examiner*—Bradley H Thomas
(74) *Attorney, Agent, or Firm*—Jimmy L. Funke

(57) ABSTRACT

An electronic device is provided having a bimetallic fluid circulator for circulating fluid coolant in relation to electrical circuitry to provide enhanced heat exchange. The fluid circulator includes a first thin sheet exhibiting a first coefficient of thermal expansion and the second thin sheet dissimilar from the first thin sheet and exhibiting a second CTE that is substantially different than the first CTE. The first and second thin sheets are bonded together. The first and second thin sheets expand and contract at different rates based on changes in temperature such that the first and second thin sheets change shape to create a fanning motion to circulate the fluid and thus cool the electrical device.

16 Claims, 4 Drawing Sheets

U.S. PATENT DOCUMENTS

| | | |
|---|---|---|
| 7,307,841 B2 * | 12/2007 | Berlin et al. ................ 361/699 |
| 2002/0105781 A1 | 8/2002 | Ohashi et al. |
| 2005/0077614 A1 | 4/2005 | Chengalva et al. .......... 257/706 |
| 2005/0168947 A1 | 8/2005 | Mok et al. |
| 2005/0279109 A1 | 12/2005 | Chrysler et al. |
| 2006/0007656 A1 | 1/2006 | Symons |
| 2007/0025081 A1 | 2/2007 | Berlin et al. |
| 2007/0295481 A1 * | 12/2007 | Campbell et al. .......... 165/80.4 |

OTHER PUBLICATIONS http://www.piezo.com/prodfan1vac.html, 115VAC/60Hz Piezo Fan Blade, Piezo Systems, Inc., Catalog #7, 2006, cover page and p. 12.

http://www.piezo.com/prodfan31v02.html, 12-15 VDC/Low Power Piezo Fan Blade and Fan Kit, Piezo Systems, Inc., Catalog #7, 2006, cover page and p. 13.

European Search Report dated Jun. 11, 2008.

* cited by examiner

FLUID CIRCULATOR FOR FLUID COOLED ELECTRONIC DEVICE

TECHNICAL FIELD

The present invention generally relates to thermal cooling of electronic assemblies and, more particularly, relates to a fluid circulator for use in an electronics assembly having a cooling fluid for circulating the cooling fluid.

BACKGROUND OF THE INVENTION

Electronic devices typically employ electronics and generally contain electrical circuitry for conducting electrical current which, in turn, generates thermal energy (i.e., heat). Many electronic devices often employ electrical circuitry in the form of integrated circuitry provided on a printed circuit board and packaged within a housing for protecting the electrical circuitry from exposure to moisture and physical contact. The generated thermal energy within the housing generally results in increased temperature. Excessive heat build-up may cause reduced performance including electrical circuit failure. Thus, it is desired to dissipate thermal energy away from the electronic device to ensure proper operation of the device.

Conventional techniques for dissipating thermal energy away from an electronic device include the use of a thermally conductive heat sink supported in contact with a packaged integrated circuit component. Typically, this technique includes mounting the heat sink onto a printed circuit board which contains surface mount electronic packages in thermal communication with the heat sink. Other conventional approaches for cooling electrical devices employ a fluid cooling medium such as air or liquid passed in thermal communication with the heat generating circuitry. The cooling fluid is typically circulated with a fan or pump.

One proposed electronic assembly employs a piezo fan for circulating a cooling fluid. One example of such use of a piezo fan is disclosed in U.S. patent application Ser. No. 11/191,822, filed on Jul. 28, 2005, now U.S. Pat. No. 7,307,841, assigned to the assignee of the present application, which is hereby incorporated herein by reference. The aforementioned piezo fan is a fluid circulator located within a heat sink housing for circulating cooling fluid in close relation to electrical components to enhance the heat transfer cooling of the electronic device. The piezo fan includes a piezoceramic with an overlying electrode and an underlying electrode and a fan blade adhered to one side. The electrodes are electrically energized to create a polarization field through the piezoceramic with causes the piezoceramic to expand or contract which induces the fan blade to stretch or bend. By reversing the electric field, a fanning oscillation effect is produced to circulate the cooling fluid. One example of a commercially available piezo fan is Model No. RFN1-005, commercially available from Piezo Systems, Inc.

While conventional piezo fans and other fluid circulators produce fluid circulation to enhance the thermal energy transfer, such devices often require additional drive circuitry. For example, the piezo fan typically requires a suitable voltage supply and a sinusoidal oscillator to power the electrodes. This may result in added cost and size constraints. The resulting fluid flow achieved with such prior known circulators may be insufficient to achieve optimal cooling for some applications.

It is therefore desirable to provide for a fluid circulator that enables the realization of enhanced cooling of heat generating electronic devices. In particular, it is desirable to provide a fluid circulator that sufficiently circulates fluid coolant with a device that minimizes the cost and complexity of the fluid circulator.

SUMMARY OF THE INVENTION

In accordance with the teaching of the present invention, a fluid circulator is provided for circulating fluid to transfer thermal energy. The fluid circulator includes a first sheet exhibiting a first coefficient of thermal expansion, and a second sheet dissimilar from the first sheet and exhibiting a second coefficient of thermal expansion that is substantially different from the first coefficient of thermal expansion. The fluid circulator also includes a bonding medium connecting together the first and second sheets. The first and second sheets expand and contract at different rates based on changes in temperature such that the first and second sheets change shape to create a fanning motion to circulate a fluid.

According to another aspect of the present invention, an electronic device is provided that employs a fluid circulator to circulate fluid coolant. The electronic device includes a housing having walls defining a fluid vessel, and electrical circuitry located in the housing, wherein the electrical circuitry generates thermal energy when conducting electrical current. The electronic device also includes a fluid in fluid communication with the fluid vessel and further in heat transfer relationship with the electrical circuitry. The electronic device further includes a fluid circulator located in fluid communication with the fluid for circulating the fluid to cool the electrical circuitry. The fluid circulator includes a first sheet exhibiting a first coefficient of thermal expansion, and a second sheet dissimilar from the first sheet and exhibiting a second coefficient of thermal expansion that is substantially different than the first coefficient of thermal expansion. The fluid circulator also includes a bonding medium connecting together the first and second sheets. The first and second sheets expand and contract at different rates based on changes in temperature such that the first and second sheets change shape to create a fanning motion to circulate the fluid.

The fluid circulator advantageously circulates the fluid coolant to enhance the heat transfer relationship, thus enhancing cooling of the electronic device. The fluid circulator offers enhanced fluid flow at a reduced complexity and cost. The assembled electronic device is able to realize enhanced cooling with few components and at reduced cost.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
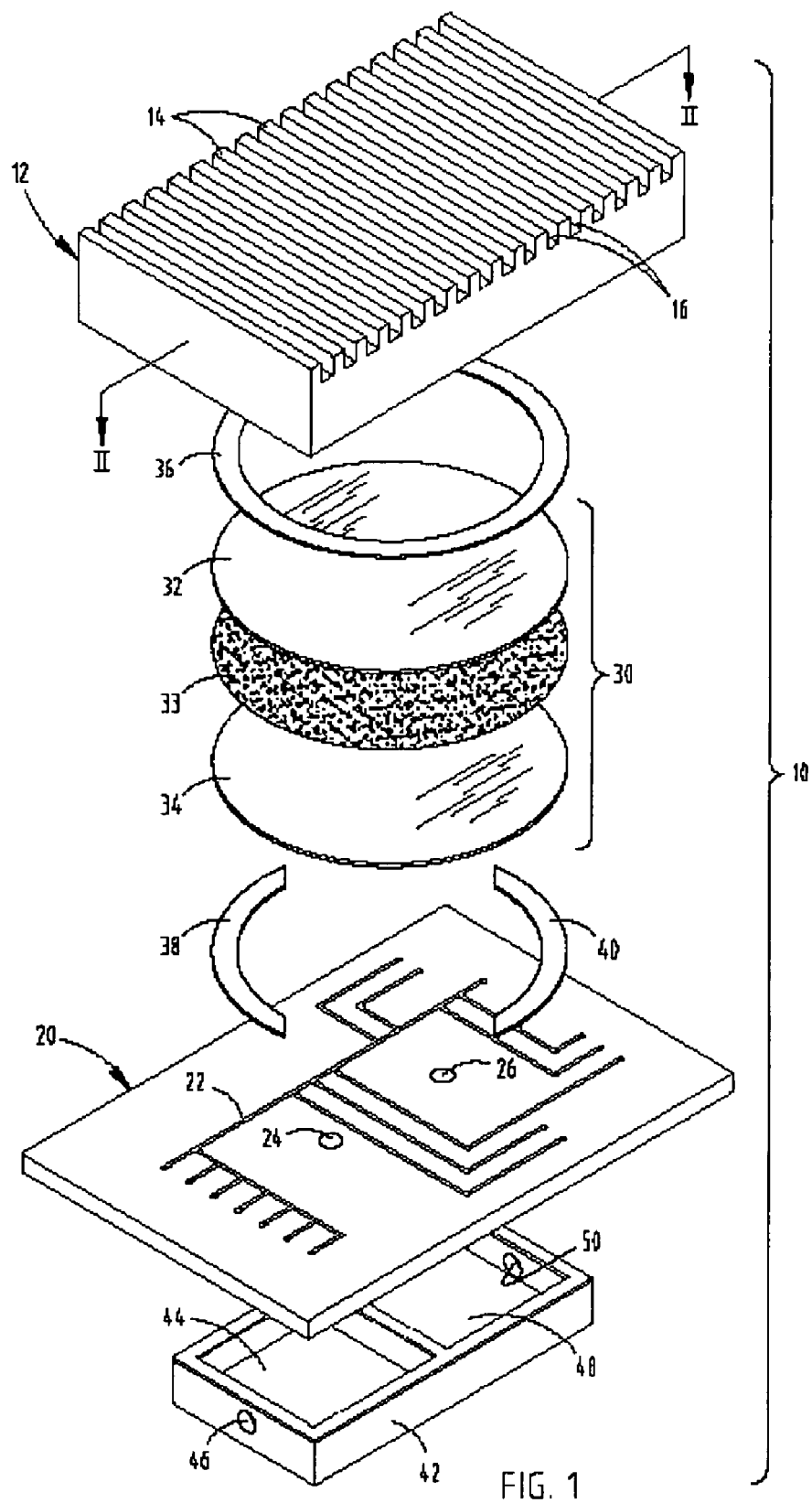
FIG. 1 is a perspective exploded view of an electronic device assembly employing a fluid circulator according to a first embodiment of the present invention.
Figure 2:
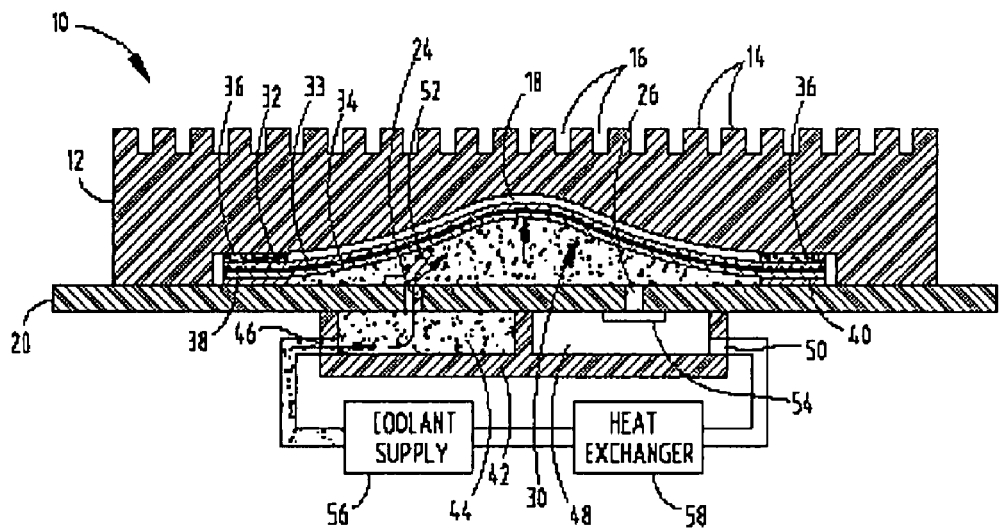
FIG. 2 is a cross-sectional view of the electronic device taken through line II-II in FIG. 1 shown with the fluid circulator in an expanded position and a fluid coolant supply.
Figure 3:
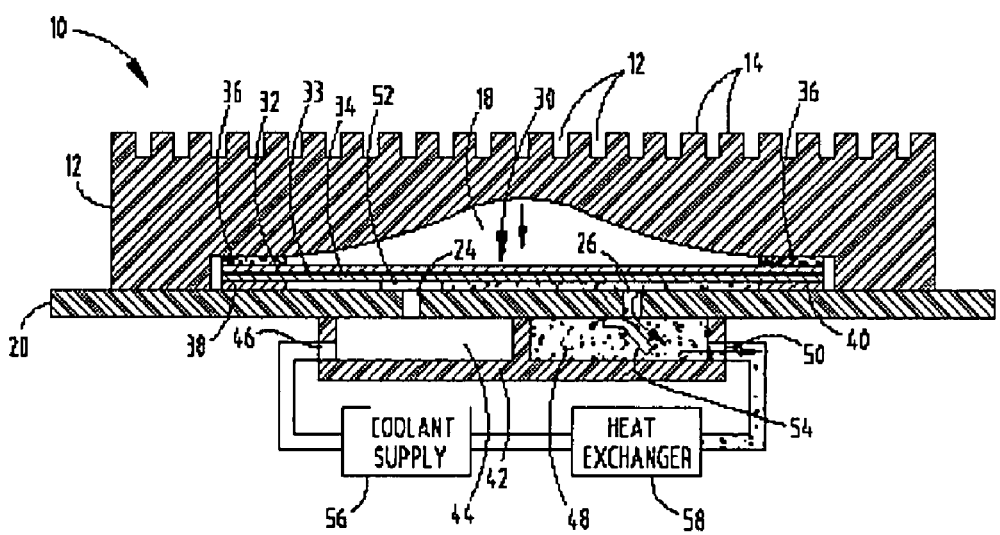
FIG. 3 is a cross-sectional view of the electronic device taken through line II-II in FIG. 1 shown with the fluid circulator in a contracted position.

Referring now to FIGS. 1-3, an electronic device 10 (also referred to as an electrical device or an electronic assembly) is generally illustrated employing a fluid circulator 30 according to a first embodiment of the present invention. The electronic assembly 10 includes a printed circuit board 20 connected to a housing 12. Together, the housing 12 and circuit board 20 enclose and define a fluid vessel cavity 18 configured to receive a fluid coolant. Provided within the cavity 18 is the fluid circulator 30 for circulating the fluid coolant to enhance the thermal energy (heat) exchange to dissipate heat away from heat generating components within the device 10.

The printed circuit board 20 is shown having electrical circuitry 22, according to one embodiment. The circuit board 20 may include a substrate made of a low temperature co-fired ceramic (LTCC), an organic material such as FR4, a metal such as stainless steel or any other suitable material. The circuit board 20 may include electrical circuitry 22 formed on the top side surface as shown and/or bottom side surface, as well as between laminated intermediate layers of the circuit board 20. The circuit board 20 may further be configured with electrical circuitry in the form of surface mount components mounted on the circuit board, such as resistors, capacitors, diodes, transistors (e.g., FETs and IGBTs), and other semiconductor chips.

The housing 12 is made of a thermally conductive medium and, thus, serves as a heat sink according to the disclosed embodiments. The heat sink housing 12 is shown having a generally rectangular shape with four side walls and a top wall. Integrally formed in the top wall of the housing 12 are a plurality of cooling fins 14 spaced apart via channels 16 to enhance thermal energy transfer (e.g., convention) with the outside environment. According to one exemplary embodiment, the heat sink housing 12 may employ a stamping/brazing construction configured with the cavity 18 on the underside and the cooling fins 14 on the topside. Other sizes and shapes of housing 12 may be employed.

The circuit board 20 is connected (e.g., adhered and/or fastened) to the bottom surface of the heat sink housing 12 to define the sealed fluid cavity 18. The circuit board 20 is shown configured with fluid inlet and outlet ports 24 and 26 for allowing ingress (intake) and egress (exhaust) of the fluid coolant to and from the cavity 18. Located on the top side of circuit board 20 at inlet 24 is an inlet check valve 52 that allows one way fluid flow into fluid vessel cavity 18, while preventing fluid flow in the opposite direction. Located on the bottom side of circuit board 20 at outlet 26 is an outlet check valve 54 that allows one way fluid flow out of fluid vessel cavity 18, while preventing fluid flow in the opposite direction.

A fluid coupler 42 is sealingly engaged to the bottom side of circuit board 20. The fluid coupler 42 has an inlet chamber 44 and an inlet hose coupling 46 for supplying fluid coolant to the inlet 24. The fluid coupler 42 also has an outlet chamber 48 and outlet hose coupling 50 for receiving fluid coolant from outlet 26. Cooling fluid exiting the cavity 18 is exhausted through outlet 26, chamber 50, and outlet coupling 50 and passes to an external heat exchanger 58 which cools the fluid and supplies cooled fluid to a coolant supply 56. The coolant supply 56 is used to supply fluid that passes through inlet coupling 46, inlet chamber 44 and inlet port 24 into cavity 18 to compete a closed loop cooling cycle, according to one embodiment. In an exemplary vehicle application, the external heat exchanger 58 may employ a cooling radiator (not shown), such as an automotive vehicle radiator.

The fluid coolant may include a liquid, such as a dielectric liquid, according to one embodiment. Examples of suitable dielectric fluid include Fluoriner™ electronic liquid FC-43 and Fluoriner™ electronic liquid FC-77, both commercially available from 3M. Another example of dielectric fluid includes perfluorinated fluids, such as Flutec® PP9 commercially available from F2 Chemicals Ltd. A further example of dielectric fluid includes Galden D-03 commercially available from Ausimont S.p.A. According to another embodiment, the cooling fluid may include air.

The fluid circulator 30 includes two thin film sheets 32 and 34 made of dissimilar materials exhibiting substantially different coefficients of thermal expansion (CTE). The upper and lower thin film sheets 32 and 34 are thin relative to the major surface defined by the length and width and are rigidly bonded together on major surfaces. According to one embodiment, the sheets 32 and 34 are bonded together via adhesive 33. According to another embodiment, sheets 32 and 34 are bonded together via cladding. The bonding medium may be uniformly provided between sheets 32 and 34.

The fluid circulator 30 is shown in the disclosed embodiments having a circular or disc shape disposed within a like sized and shaped cavity 18. The fluid circulator 30 moves between the expanded position in which the central portion of the fluid circulator 30 bends upwards and a contracted position in which the fluid circulator 30 is substantially flat. In effect, the fluid circulator 30 operates as a diaphragm to create a fanning action, and more specifically a pumping action to pump fluid in and out of fluid vessel cavity 18. It should be appreciated that the fluid circulator 30 may be configured in other shapes and sizes. According to other embodiments, fluid circulator 30 may be configured in the shape of a rectangle. Further, other embodiments may include the fluid circulator 30 connected to a rigid support structure on one side and free on the other end such that the fluid circulator 30 bends back and forth to create a fanning action to move fluid.

Since the dissimilar materials of thin film sheets 32 and 34 exhibit substantially different CTEs, relative to each other, one of the sheets 32 and 34 will change dimension at a larger rate than the other sheet. The fluid circulator 30 may be assembled including adhering the first and second sheets 32 and 34 together at an intended minimum operating temperature, such as room temperature, so that the fluid circulator 30 is substantially flat at the assembled temperature. When the fluid circulator 30 is subjected to an increase in temperature, the sheet with the larger CTE will expand more than the sheet with the lower CTE, thus creating a bending action in the rigidly connected sheets 32 and 34. Contrarily, when subjected to a decrease in temperature, the sheet with the larger CTE will contract more than the sheet with the lower CTE, thus creating further bending action. The fluid circulator 30 bends back and forth between expanded and contracted positions when exposed to temperature excursions to create a pumping or other fanning action. By controlling the temperature excursions, the pumping or other fanning action can thereby be controlled.

According to one embodiment, the upper and lower thin film sheets 32 and 34 are formed of dissimilar metals exhibiting substantially different CTEs. CTEs are substantially different if the difference in CTEs is at least 5 ppm per degree Celsius. In one exemplary embodiment, the upper sheet 32 is made of aluminum exhibiting a CTE of about 24 parts per million (ppm) per degree Celsius, and the lower sheet 34 is made of stainless steel exhibiting a CTE of about 10 ppm per degree Celsius. In one example, the lower sheet 34 is a one mil thick aluminum film adhesively bonded to upper sheet 32 which is a one mil thick stainless steel film, which together in a 2.5inch span may produce a one inch deflection when subjected to a 25° C. temperature change. The upper and lower sheets 32 and 34 each have a thickness less than five mils, according to one embodiment.

In some embodiments, the aluminum upper sheet 32 may be pulsed with electrical current to generate a cyclical motion. Additionally, a serpentine pattern of aluminum can be used to increase an electrical resistance of the upper sheet 32. In effect, the aluminum provides a resistance that generates thermal energy when transmitting electrical current. Other potential resistor materials may be employed on either the upper or lower sheets 32 and 34. Examples of other potential resistor materials include nickel phosphorus and carbon loaded Kapton. Additionally, a magnet may be employed to help bring the fluid circulator 30 back to a desired steady state condition to further control the cyclical fanning motion.

According to another example, the upper sheet 32 of fluid circulator 30 may include aluminum having a CTE of 24 ppm per degree Celsius, and the lower sheet 34 may include aramide fiber filled film having a CTE of 4 ppm per degree Celsius. It should be appreciated that other mediums, including metallic and non-metallic mediums, may be employed as the upper and lower sheets 32 and 34 of fluid circulator 30, according to other embodiments of the present invention.

In the embodiment shown in FIGS. 1-3, the fluid circulator 30 is disposed within cavity 18 such that the upper sheet 34 is adhesively bonded via adhesive 36 to housing 12. The adhesive 36 may include a ring-shaped adhesive applied near the perimeter in the disclosed embodiment with a circular fluid circulator 30. The adhesive 36 holds and thereby maintains the periphery of the fluid circulator 30 in relation to the housing 12.

The lower sheet 34 is bonded to electrically conductive contact pads 38 and 40 on opposite sides. In one embodiment, electrically conductive pads 38 and 40 allow electrical current to be applied across the lower sheet 34. When the upper sheet 32 and/or lower sheet 34 are electrically conductive and have a heat generating resistance, electrical current passes from one of contact pads 38 to the other of contact pads 38 (or vice versa) by flowing through the upper sheet 32 and/or lower sheet 34, which generates thermal energy.

As seen in FIG. 2, the fluid circulator 30 is shown in an expanded position such that the layers 32 and 34 are bent upwards in the central region. When the fluid circulator 30 moves to the expanded position, fluid coolant is pumped via suction into a fluid vessel cavity 18 from the coolant supply 56 through coupler 42 and through intake port 24 as check valve 52 is pulled open. The fluid circulator 30 moves to the expanded position when sheets 32 and 34 expand. Since the coefficient of thermal expansion of the upper sheet 32 is different than the lower sheet 34, the upper sheet is able to expand more than the lower sheet 34 and, thus, has a bubble shape as shown in FIG. 2.

When the fluid circulator 30 is sufficiently cooled, both sheets 32 and 34 contract, although at different rates to move to the retracted position seen in FIG. 3. It should be appreciated that the heat sink housing 12 sufficiently cools the upper layer 32 of fluid circulator 30, which causes both sheets 32 and 34 to contract. Since the upper sheet 32 contracts faster than the lower sheet 34 due to the different CTEs, the fluid circulator 30 moves to a substantially flat shape. Upon retracting to its retracted position, fluid circulator 30 pumps (forces) fluid coolant from within the fluid vessel cavity 18 out of the outlet port 26 due to pressure forcing check valve 54 open, and the fluid proceeds through coupler 42 to the heat exchanger 58 for cooling.

By configuring the fluid circulator 30 with a resistive heating element built into the upper sheet 32, and positioning the upper sheet 32 such that it is in thermal communication with the heat sink housing 12 when in the expanded position, a controlled cyclical pumping or other fanning action can be created. That is, the fluid circulator 30 may be controllably forced to expand to its expanded position by heating the upper and lower sheets 32 and 34 and then is cooled on the upper sheet 32 by heat sink housing 12. It should be appreciated that the lower sheet 34 is subject to heat generated by electrical circuitry 22 provided on the circuit board 20, whereas upper sheet 32 is cooled by heat sink housing 12. By further applying electrical current through the upper sheet 32 to generate further additional heat, a more controlled cyclical pumping or other fanning action can be generated. That is, in order to more quickly expand the fluid circulator 30, electrical current may be applied to contact pads 38 and 40 to generate additional heat within the fluid circulator 30 to cause the expansion to occur more quickly. By circulating the coolant fluid within cavity 18, the electrical circuitry on circuit board 20 is cooled quicker due to the transfer of thermal energy generated by the electrical circuitry 22 to the fluid coolant which then is forced to exchange thermal energy via the heat exchanger 58.

Figure 4:
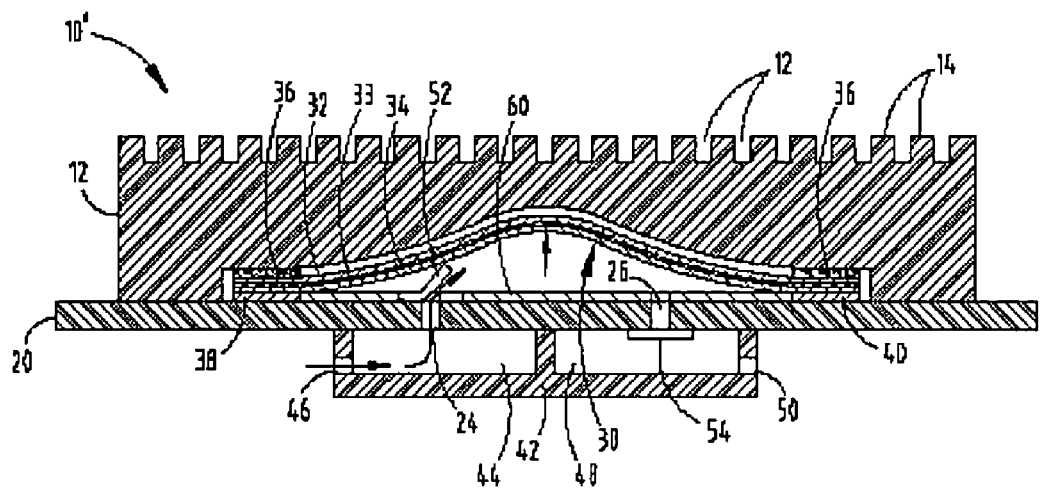
FIG. 4 is a cross-sectional view of an electronic device having a fluid circulator according to a second embodiment of the present invention, with the fluid circulator shown in an expanded position.
Figure 5:
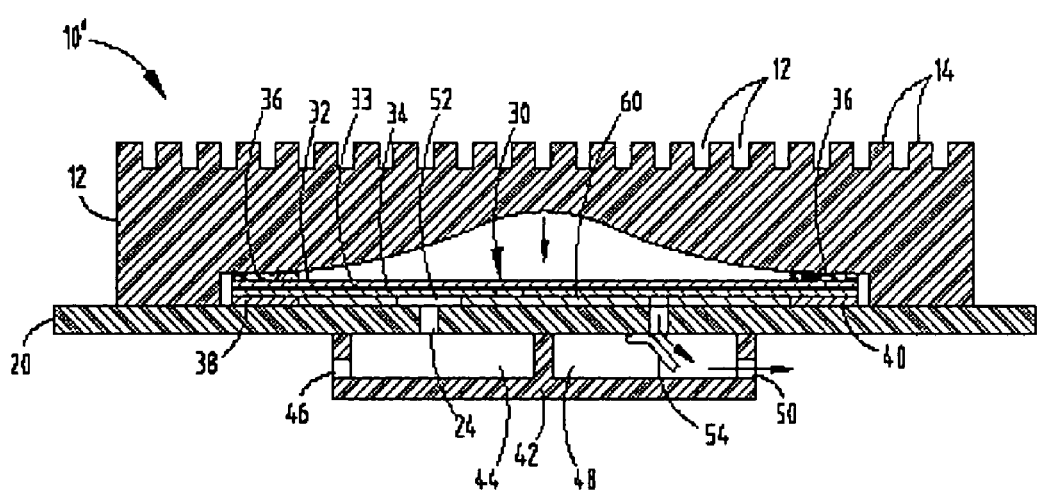
FIG. 5 is a cross-sectional view of the electronic device shown in FIG. 4, with the fluid circulator shown in a contracted position.

Referring to FIGS. 4 and 5, an electrical device 10' is illustrated employing a fluid circulator 30 in relation to a resistive heating element 60 mounted on the top surface of circuit board 20, according to a second embodiment. The resistive element 60 is in contact with contact pads 38 and 40. Electrical current may be applied to contact pad 38 which passes through resistive heating element 60 to pad 40 (or vice versa) so as to generate thermal energy via resistive heating elements 60. According to this embodiment, a separate resistive element 60 is employed separate from the fluid circulator 30.

The electrical device 10' operates similar to the electrical device set forth in the first embodiment above. That is, the fluid circulator 30 moves from an expanded position shown in FIG. 4 to a contracted position shown in FIG. 5. Lower sheet 34 is located in thermal communication with the resistive heating element 60. Upon resistive heating element 60 generating thermal energy, the fluid circulator 30 more quickly expands from its retracted to its expanded position. The fluid coolant cycles in and out of the fluid vessel cavity 18 as described above to cool the device 10'.

It should be appreciated that to control the movement of the thin film sheets 32 and 34, electrical current can actively be supplied at a controlled rate to create a desired temperature differential according to the first and second embodiments. The temperature of the lower sheet 34 rapidly increases when electrical current is applied to generate added heat. With this increase in temperature, the thin film sheets 32 and 34 rapidly deflect due to the mismatch in the CTE within the structure. The structure rapidly cools when the current source is removed from the resistive element due to the cooling provided by the heat sink housing 12 to the upper sheet 32. It should be appreciated that the peripheral upper ends of the upper sheet are attached to the heat sink via a thermally conductive electrically insulative adhesive 36 so as to further insure enhanced cooling to the top surface of the fluid circulator 30. Since the fluid circulator 30 can be controlled in movement, this becomes an active device which requires simple control circuitry, such as oscillation circuitry, to control the rate of the fanning action. It should be appreciated that a feedback system could be further employed based on device temperature such as that sensed by a temperature sensing diode, to further enhance the controlled fluid circulation.

Figure 6:
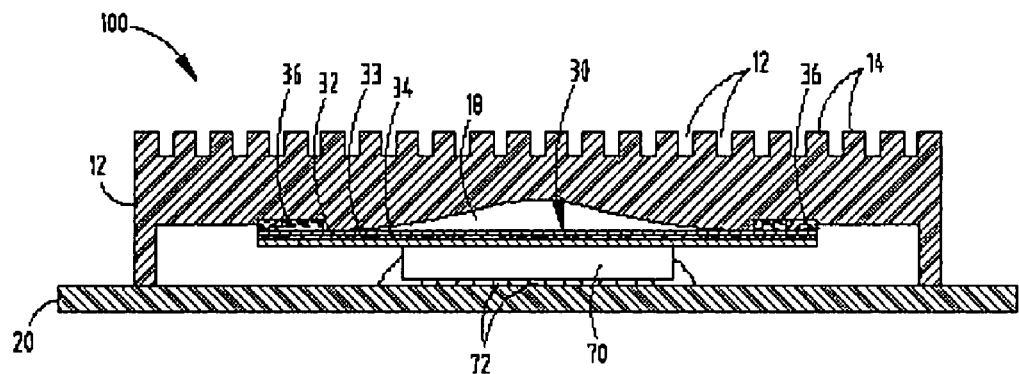
FIG. 6 is a cross-sectional view of an electronic device having a fluid circulator according to a third embodiment of the present invention, with the fluid circulator shown in a contracted position.
Figure 7:
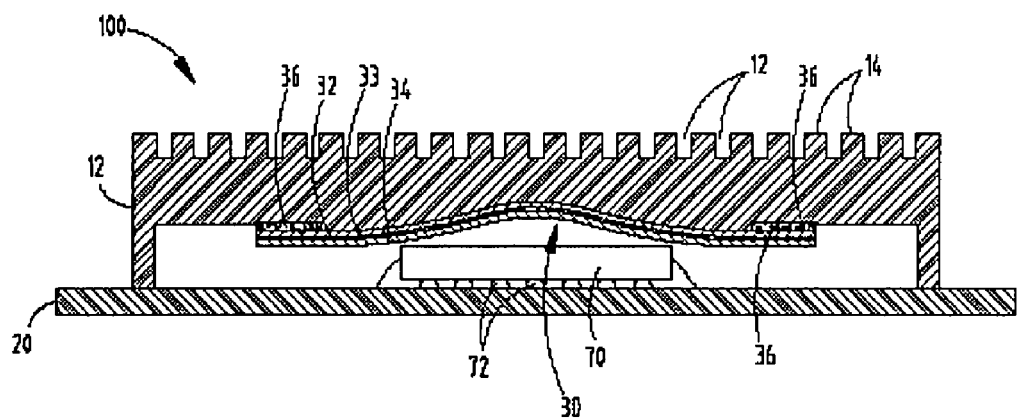
FIG. 7 is a cross-sectional view of the electronic device shown in FIG. 6, with the fluid circulator shown in an expanded position.

Referring to FIGS. 6 and 7, an electronic (electrical) device 100 is shown according to a third embodiment employing the fluid circulator 30 arranged on top of an electronic package 70. The electronic package may include a flip chip or any other electrical device (e.g., component) that generates thermal energy. The electronic package 70 shown is configured as a flip chip having a flat top surface and solder bumps 72 on the bottom connecting the flip chip to the printed circuit board 20. In this embodiment, the fluid circulator 30 rests on or in close heat transfer relation to the top surface of the electronic package 70 when in the contracted position as seen in FIG. 6.

By mounting the fluid circulator 30 in close relation to the electronic package 70, the package 70 with its electrical circuitry generates thermal energy which, in turn, heats the lower sheet 34 of fluid circulator 30. Upon heating fluid circulator 30, the fluid circulator 30 moves from its flat contracted position shown in FIG. 6 to its expanded bent position shown in FIG. 7. It should be appreciated that the movement from the contracted to the expanded position of fluid circulator 30 causes fluid within the cavity 18 to circulate and thus enhances the cooling of the electronic package 70. It should further be appreciated that the fluid vessel cavity 18 may be connected to an outside fluid coolant source as set forth in the embodiments above. Alternately, the fluid vessel cavity 18 may be a closed cavity, with the fluid circulator 30 circulating fluid within the closed cavity.

Accordingly, the fluid circulator 30 employed to cool the electronic package 70 provides a passive fluid circulation device that requires no external electronic control circuitry to produce movement or enhanced movement or control of the fluid circulator 30. The fluid circulator 30 moves between the heat generating electronic package 70 on the bottom side and the cooler heat sink housing 12 on the top side at a rate dependent upon the temperature differential encountered. Thus, the temperature differential creates the natural cyclical motion of the fluid circulator 30 to create fluid movement which, in turn, cools the electronic package 70.

By bonding two thin sheets, such as two metals, with dissimilar thermal expansion coefficients, a fluid circulator 30 can be provided for enhancing the fluid coolant flow in the electrical device. The fluid circulator 30 can be modeled and the amount of bending achieved with a given circulator 30 can be computed based on the following exemplary equation:

$$z = \frac{3x^2(\alpha_1 - \alpha_2)\Delta T(h_1 + h_2)}{\frac{h_1^3}{h_2}\frac{E_1}{E_2} + 4(h_1^2 + h_2^2) + 6h_1 h_2 + \frac{E_2}{E_1}\frac{h_2^3}{h_1}},$$

wherein z represents the deflection in the Z-axis at coordinate x, $\Delta T$ represents the temperature change, $\alpha_1$ and $\alpha_2$ represent the CTE of sheets 1 and 2 (e.g., upper and lower sheets), $E_1$ and $E_2$ represent the modulus of sheets 1 and 2 (e.g., upper and lower sheets) and $h_1$ and $h_2$ represent a thickness of sheets 1 and 2 (e.g., upper and lower sheets). Thus, the amount of movement achievable with the fluid circulator 30 can be calculated so that an optimum fluid circulator 30 may be configured for a given electronic device.

By enhancing the heat dissipation with the fluid circulator 30, the electronic device 10 advantageously allows for the reduction in the number and/or size of electrical circuitry used in the assembly 10. Additionally, the enhanced heat dissipation achieved by employing the fluid circulator 30 of the present invention may allow for an increase in the power output of the electrical circuitry, thereby improving the overall performance of the electronic device 10. These and other advantages may be achieved by the novel fluid circulator 30 and its use in an electronic device according to the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A fluid circulator for moving a fluid to transfer thermal energy away from electrical circuitry to cool the electrical circuitry, said fluid circulator comprising:
   a housing comprising walls defining a fluid vessel for receiving fluid and electrical circuitry in heat transfer relationship with the fluid the housing comprising a thermally conductive heat sink, and a circuit board comprising the electrical circuitry, wherein the circuit board forms a wall of the housing to define the fluid vessel;
   the fluid circulator disposed within the fluid vessel and located in fluid flow communication with the fluid for circulating the fluid to cool the electrical circuitry, wherein the fluid circulator comprises:
   a first sheet exhibiting a first coefficient of thermal expansion (CTE);
   a second sheet dissimilar from the first sheet and exhibiting a second CTE that is substantially different tan the first CTE, wherein the second sheet comprises an electrically conductive medium having a resistance such that the second sheet generates thermal energy when electrical current is applied across the second sheet to provide a change in temperature; and
   a bonding medium connecting together the first and second sheets, wherein the first and second sheets expand and contract at different rates based on changes in temperature such that the first and second sheets change shape to create a fanning motion to circulate the fluid in heat transfer relationship with the electrical circuitry to cool the electrical circuitry.

2. The fluid circulator as defined in claim 1, wherein the first sheet comprises a first metallic sheet, and wherein the second sheet comprises a second metallic sheet.

3. The fluid circulator as defined in claim 2, wherein the first metallic sheet comprises aluminum and the second metallic sheet comprises steel.

4. The fluid circulator as defined in claim 1, wherein the first and second sheets each have a thickness less than five mils.

5. The fluid circulator as defined in claim 1, wherein the first sheet is adapted to be located in thermal communication with a first environment and the second sheet is adapted to be located in thermal communication with a second environment, wherein the first environment is cooler than the second environment.

6. The fluid circulator as defined in claim 1, wherein the second sheet is adapted to be located in thermal communication with a resistive heating element.

7. The fluid circulator as defined in claim 1, wherein the second sheet is adapted to be located in thermal communication with a packaged electrical component.

8. An electronic device having fluid cooling of electrical circuitry, said device comprising:
- a housing comprising walls defining a fluid vessel the housing comprising a thermally conductive heat sink, and a circuit board comprising the electrical circuitry, wherein the circuit board forms a wall of the housing to define the fluid vessel;
- the electrical circuitry located in the housing, wherein the electrical circuitry generates thermal energy when conducting electrical current;
- a fluid in fluid communication with the fluid vessel and further in heat transfer relationship with the electrical circuitry; and
- a fluid circulator disposed within the fluid vessel and located in fluid flow communication with the fluid for circulating the fluid to cool the electrical circuitry, wherein the fluid circulator comprises:
  - a first sheet exhibiting a first coefficient of thermal expansion (CTE);
  - a second sheet dissimilar from the first sheet and exhibiting a second CTE that is substantially different than the first CTE, wherein the second sheet comprises an electrically conductive medium having a resistance such that the second sheet generates thermal energy when electrical current is applied across the second sheet to provide a change in temperature; and
  - a bonding medium connecting together the first and second sheets, wherein the first and second sheets expand and contract at different rates based on changes in temperature such that the first and second sheets change shape to create a fanning motion to circulate the fluid to cool the electrical circuitry.

9. The electronic device as defined in claim 8, wherein the heat sink housing further comprises a plurality of cooling fins.

10. The electronic device as defined in claim 8, wherein die cooling fluid comprises a liquid.

11. The electronic device as defined in claim 8, wherein the first sheet comprises a first metallic sheet, and wherein the second sheet comprises a second metallic sheet.

12. The electronic device as defined in claim 11, wherein the first metallic sheet comprises aluminum and the second metallic sheet comprises steel.

13. The electronic device as defined in claim 8, wherein the first and second sheets each have a thickness less than five mils.

14. The electronic device as defined in claim 8, wherein the first sheet is located in thermal communication with the housing and the second sheet is located in thermal communication with the electrical circuitry, wherein the housing is cooler than the electrical circuitry when in operation.

15. The electronic device as defined in claim 8, wherein the second sheet is located in thermal communication with a resistive heating element.

16. The electronic device as defined in claim 8, wherein the second sheet is located in thermal communication with a packaged electrical component.

* * * * *